United States Patent
Wang

(10) Patent No.: US 7,994,564 B2
(45) Date of Patent: Aug. 9, 2011

(54) NON-VOLATILE MEMORY CELLS FORMED IN BACK-END-OF LINE PROCESSES

(75) Inventor: Shih Wei Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 548 days.

(21) Appl. No.: 11/602,065

(22) Filed: Nov. 20, 2006

(65) Prior Publication Data

US 2008/0116505 A1 May 22, 2008

(51) Int. Cl.
*H01L 29/788* (2006.01)
*H01L 21/8246* (2006.01)
*H01L 21/8247* (2006.01)

(52) U.S. Cl. ........ 257/315; 257/314; 257/316; 257/321; 257/324; 257/326; 257/E21.209; 438/211; 438/257; 438/593

(58) Field of Classification Search .............. 438/201, 438/288, 573, 652, 211, 257, 593, FOR. 189, 438/FOR. 203, FOR. 212; 257/314–326, 257/E27.078, E29.3–E29.309, E21.179–E21.182, 257/E21.209–E21.21, E21.422, E21.423, 257/E21.679–E21.694, 213, 288, 368, 681, 257/E27.102–E27.104, E21.662–E21.667, 257/E21.671

See application file for complete search history.

(56) References Cited

U.S. PATENT DOCUMENTS

| | | | | |
|---|---|---|---|---|
| 6,115,233 A | * | 9/2000 | Seliskar et al. | 361/303 |
| 6,512,263 B1 | * | 1/2003 | Yuan et al. | 257/316 |
| 6,958,513 B2 | | 10/2005 | Wang | |
| 7,829,938 B2 | * | 11/2010 | Bhattacharyya | 257/325 |
| 2004/0145009 A1 | * | 7/2004 | Min et al. | 257/321 |
| 2004/0214379 A1 | * | 10/2004 | Lee et al. | 438/149 |
| 2006/0267072 A1 | * | 11/2006 | Bhattacharyya | 257/315 |
| 2006/0278933 A1 | * | 12/2006 | Endo | 257/369 |
| 2007/0012988 A1 | * | 1/2007 | Bhattacharyya | 257/314 |
| 2007/0029625 A1 | * | 2/2007 | Lue et al. | 257/411 |
| 2007/0045711 A1 | * | 3/2007 | Bhattacharyya | 257/315 |
| 2007/0045718 A1 | * | 3/2007 | Bhattacharyya | 257/324 |
| 2007/0166908 A1 | * | 7/2007 | Min et al. | 438/216 |
| 2007/0194301 A1 | * | 8/2007 | Sezi et al. | 257/40 |
| 2007/0264776 A1 | * | 11/2007 | Dong et al. | 438/257 |
| 2008/0067577 A1 | * | 3/2008 | Wang et al. | 257/321 |
| 2008/0296653 A1 | * | 12/2008 | Ozawa et al. | 257/316 |
| 2009/0035904 A1 | * | 2/2009 | Bhattacharyya | 438/261 |

* cited by examiner

*Primary Examiner* — Matthew C Landau
*Assistant Examiner* — Maliheh Malek
(74) *Attorney, Agent, or Firm* — Slater & Matsil, L.L.P.

(57) ABSTRACT

An integrated circuit device includes a substrate; a bottom electrode over the substrate wherein the bottom electrode is in or over a lowest metallization layer over the substrate; a blocking layer over the bottom electrode; a charge-trapping layer over the blocking layer; an insulation layer over the charge-trapping layer; a control gate over the insulation layer; a tunneling layer over the control gate; and a top electrode over the tunneling layer.

8 Claims, 9 Drawing Sheets

NON-VOLATILE MEMORY CELLS FORMED IN BACK-END-OF LINE PROCESSES

TECHNICAL FIELD

This invention relates generally to semiconductor devices, and more particularly to memory cells, and even more particularly to structures and manufacturing methods of non-volatile memory cells.

BACKGROUND

Non-volatile memories, such as flash memories, have become increasingly popular in recent years. A typical flash memory comprises a memory array having a large number of memory cells arranged in blocks. One of the most commonly known flash memories is the one-transistor flash memory, wherein each of the memory cells is fabricated as a field-effect transistor having a control gate and a floating gate. The floating gate is capable of holding charges and is separated from source and drain regions contained in a substrate by a layer of thin oxide (tunneling oxide). Each of the memory cells can be electrically charged by injecting electrons from the drain region through the tunneling oxide layer onto the floating gate. The charges can be removed from the floating gate by tunneling the electrons to the substrate through the tunneling oxide layer during an erase operation. Thus the data in a memory cell is determined by the presence or absence of charges in the floating gate.

In current state-of-the-art non-volatile memories, high voltage (typically ranging from 9V to 20V) is typically used in cell operations (e.g., erase and program operations) in order to achieve desired memory states. Infrastructure for on-chip high voltage generation is thus essential to support the memory cell operations and has become an essential block in non-volatile memories and products. The infrastructure involves separate sets of transistors used for handling high voltages and typically requires adding at least five extra masks to a conventional CMOS technology. Therefore, the additional masks complicate process technology for non-volatile memories.

Another issue on the high-voltage infrastructure is its scalability along new generation technology. The high voltage is found un-scalable or difficult to be scaled due to the physics employed in memory cell operation. In contrast, the operating voltage for logic circuits has been continuously scaled down over the previous decades accordingly with the scaling of the minimum geometry of CMOS technology. An increasingly larger gap is observed between voltages operating the logic circuits and the memory cells. The issue is more pronounced and aggravated as CMOS technology is scaled beyond 0.25 µm generation. As a result, a larger overhead, in terms of the area occupied by high voltage circuitry, is often seen in newer generation memory products (in both stand-alone and embedded non-volatile memory products). The scaling limit on high voltage circuitry further imposes constraints on the scaling of the minimum feature size for high-voltage transistors. Often, the same sets of design rules for high-voltage transistors are used from one generation of products to the next. Furthermore, the high voltage operation introduces more issues in product functionality and reliability area.

U.S. Pat. No. 6,958,513 discusses a flash memory cell capable of operating under low operation voltages, for example, as low as about 5 volts. The structure of the flash memory cell is illustrated in FIG. 1, which includes a floating gate 2 formed in a well region 4, a control gate 6 over floating gate 2, and a top poly gate 8 over control gate 6. Top poly gate 8 and control gate 6 are separated by a first insulator 10, and control gate 6 and floating gate 2 are separated by a second insulator 12. In a program operation, a negative bias is applied to top poly gate 8 with respect to control gate 6, and thus electrons are injected into control gate 6 from top poly gate 8. The second insulator 12 has a conduction band level lower than the energy level of the electrons, and thus at least a portion of the electrons are ballistic-injected into floating gate 2. In an erase operation, a positive bias voltage is applied to top poly gate 8 with respect to control gate 6, and holes are injected into control gate 6 from top poly gate 8. Second insulator 12 has a valence band level lower than the energy level of the holes, and thus at least a portion of the holes are ballistic-injected into floating gate 2. The operation voltages of the above-discussed flash memory cell are far lower than other commonly used flash memory cells.

The above-discussed structure, however, involves complicated trench and poly formation processes. In addition, the erase operation may involve the injection of hot holes that can cause damage to the substrate over time. New methods and structures are thus needed to solve these problems.

SUMMARY OF THE INVENTION

In accordance with one aspect of the present invention, an integrated circuit device includes a substrate, a bottom electrode over the substrate wherein the bottom electrode is in or over a lowest metallization layer over the substrate, a blocking layer over the bottom electrode, a charge-trapping layer over the blocking layer, an insulation layer over the charge-trapping layer, a control gate over the insulation layer, a tunneling layer over the control gate, and a top electrode over the tunneling layer.

In accordance with another aspect of the present invention, an integrated circuit device includes a substrate, a first metallization layer over the substrate, a bottom electrode in the first metallization layer, a second metallization layer over the first metallization layer, a word-line and an operating gate in the second metallization layer, and a stacked structure between the first and the second metallization layers. The stacked structure includes a blocking layer over the bottom electrode, a charge-trapping layer over the blocking layer, an insulation layer over the floating gate, a control gate over the insulation layer, wherein the control gate is electrically connected to the word-line, a tunneling layer over the control gate, and a top electrode over the tunneling layer and electrically connected to the operating gate, wherein the tunneling layer and the top electrode only overlap a portion of the control gate.

In accordance with yet another aspect of the present invention, a method for forming and operating an integrated circuit includes providing a substrate, forming a bottom electrode over the substrate wherein the bottom electrode is in or over a lowest metallization layer over the substrate, forming a blocking layer over the substrate, forming a charge-trapping layer over the blocking layer, forming an insulation layer over the charge-trapping layer, forming a control gate over the insulation layer, forming a tunneling layer over the control gate, and forming a top electrode over the tunneling layer.

In accordance with yet another aspect of the present invention, a method for forming and operating a semiconductor device includes forming a flash memory cell, which includes the steps of providing a substrate, forming a bottom electrode over the substrate wherein the bottom electrode is in a metallization layer over the substrate, forming a blocking layer over the substrate, forming a charge-trapping layer over the blocking layer, forming an insulation layer over the charge-trapping layer, forming a control gate over the insulation layer, forming a tunneling layer over the control gate, forming a top electrode over the tunneling layer, forming a word-line connected to the control gate through a first contact plug, and forming an operating gate connected to the top electrode through a second contact plug. The method further includes programming the flash memory cell by applying a negative bias voltage between the operating gate and the word-line and erasing the flash memory cell by applying a positive bias voltage between the operating gate and the word-line.

The embodiments of the present invention are formed in back-end-of-line processes, and thus there is no damage to the substrate due to hot holes. In addition, there are more choices of materials for the flash memory cells.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments of the present invention provide structures of flash memory cells and methods for forming the same in back-end-of-line processes. The intermediate stages of manufacturing an embodiment of the present invention are illustrated in FIGS. 2 through 6. Throughout the various views and illustrative embodiments of the present invention, like reference numbers are used to designate like elements.

Figure 1:
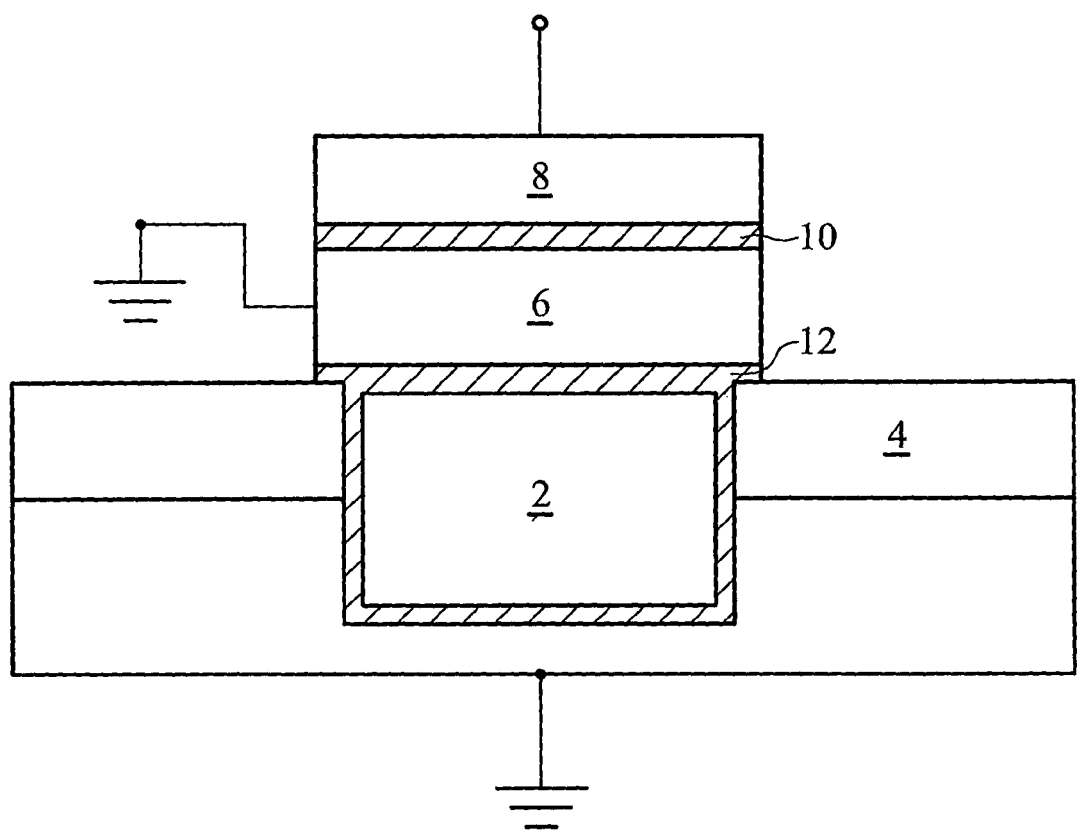
FIG. 1 illustrates a conventional flash memory cell.
Figure 2:
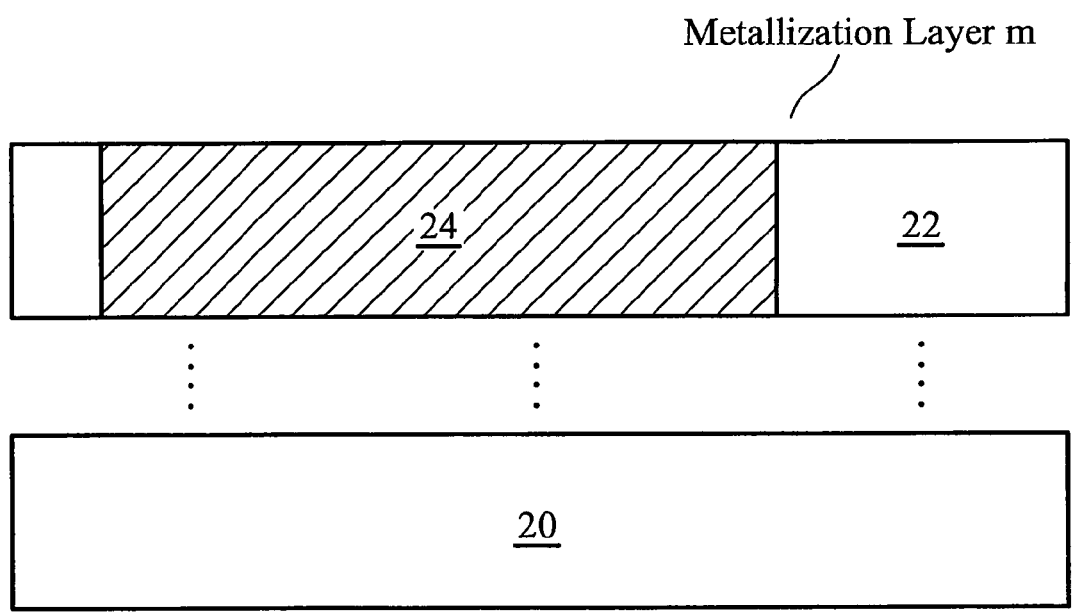
FIGS. 2 through 6 are cross-sectional views of intermediate stages in the manufacture of an embodiment of the present invention, wherein a flash memory cell is formed in back-end-of-line processes.

Referring to FIG. 2, a semiconductor substrate 20 is provided, which includes common semiconductor materials for forming integrated circuits, such as silicon, silicon germanium, and the like. Integrated circuit devices (not shown) are formed at the surface of semiconductor substrate 20.

After the formation of integrated circuit devices, back-end-of-line (BEOL) processes are performed, which processes include the formation of inter-layer dielectric (ILD) and metallization layers over the ILD. FIG. 2 illustrates the formation of a bottom electrode 24 in a metallization layer m, wherein m is an integer having a value greater than zero. Bottom electrode 24 is preferably formed using well-known damascene processes, which processes include forming a dielectric layer 22; forming openings in dielectric layer 22; filling the openings with metallic materials, such as copper or copper alloys; and then performing a chemical mechanical polish to remove excess metallic materials. The remaining metallic material forms desirable metal features including bottom electrode 24. Dielectric layer 22 preferably includes a dielectric material having a low dielectric constant (i.e., low k). Preferably, the dielectric material has a k value of less than about 3.5, and more preferably of less than about 2.5.

Figure 3:
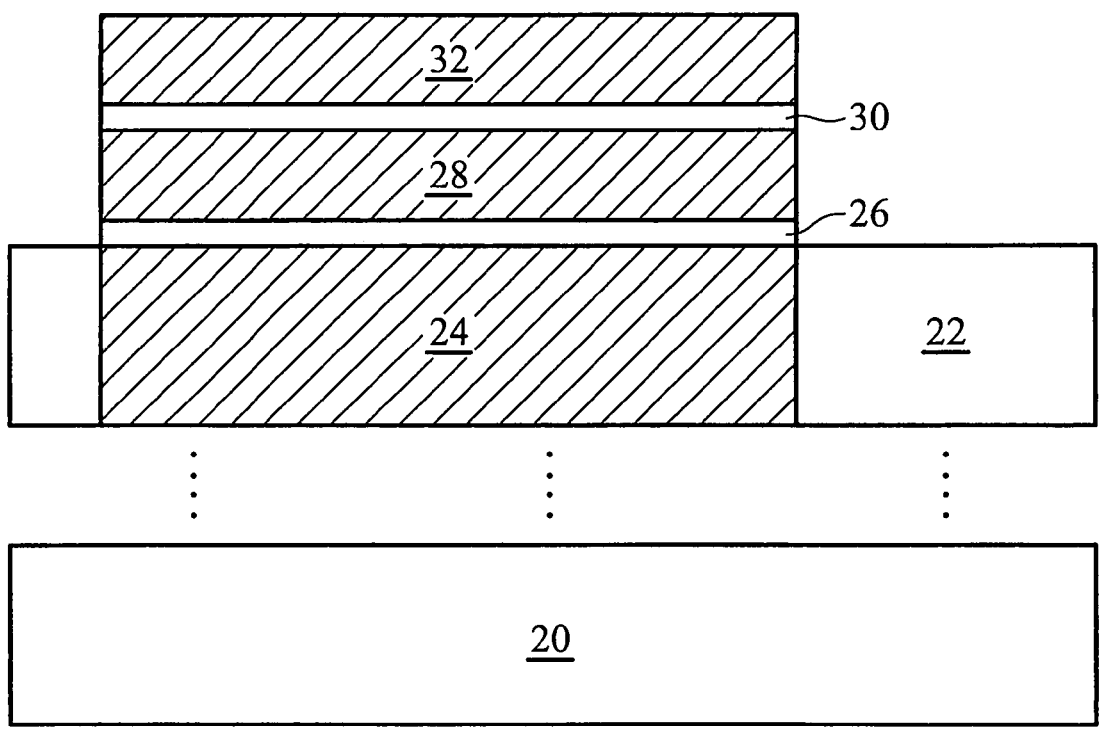

A stacked layer is then formed on bottom electrode 24, as is illustrated in FIG. 3. In the preferred embodiment, the stacked layer includes a blocking layer 26, a charge-trapping layer 28, an insulation layer 30, and a control gate 32.

Blocking layer 26 is formed over bottom electrode 24. Preferably, blocking layer 26 has a low leakage of charges. Accordingly, blocking layer 26 preferably has a high conduction band and a low valence band, hence a great band gap, so that the barrier height between the conduction band of blocking layer 26 and the conduction band of substrate 20 is high. Blocking layer 26 is preferably formed of a high-k dielectric material, such as $AlLaO_3$, $HfAlO_3$, $HfO_2$, $Ta_2O_5$, $Al_2O_3$, $ZrO_2$, $TiO_2$, $SrTiO_3$, and combinations thereof. The k value of blocking layer 26 is preferably greater than about 3.9, and more preferably greater than about 10.

Charge-trapping layer 28 is formed over blocking layer 26 and is preferably a dielectric layer with a high trap density. In the preferred embodiment, charge-trapping layer 28 comprises silicon nitride. In other embodiments, charge-trapping layer 28 comprises conductive materials such as doped polysilicon, metals, metal silicides, metal nitrides, and the like.

An insulation layer 30, which preferably includes oxides such as silicon oxide, is formed on charge-trapping layer 28. Alternatively, nitrides, oxynitrides, high-k materials such as $AlLaO_3$, $HfAlO_3$, $HfO_2$, $Ta_2O_5$, $Al_2O_3$, $ZrO_2$, $TiO_2$, $SrTiO_3$, and combinations thereof, may also be used. Insulation layer 30 may also be a composite layer comprising more than one layer, each layer comprising one or more of the above-listed materials. In the preferred embodiment, the band gap of insulation layer 30 is determined so that, in the program and erase operations, a significant percentage of electrons and holes may be tunneled through it using a ballistic tunneling mechanism. Accordingly, the materials used in insulation layer 30 are partially determined by the desired band gap, which is also related to the desired program and erase voltages. If very low program and erase voltages are desired, the band gap of insulation layer 30 is preferably very low. If, however, program and erase voltages are higher, the band gap of insulation layer 30 may be increased accordingly.

Control gate 32 overlies insulation layer 30 and preferably includes conductive materials, such as polysilicon doped with n-type or p-type impurities, metals, metal silicide, metal nitrides, and combinations thereof. The thickness of control gate 32 is preferably less than about 1000 Å, and more preferably less than about 500 Å. The stacked layer is preferably formed by sequentially and blanket forming a blocking layer, a charge-trapping layer, an insulation layer and a control gate layer, and then patterning the blanket-formed layers to form the stacked layer described above.

Figure 4:
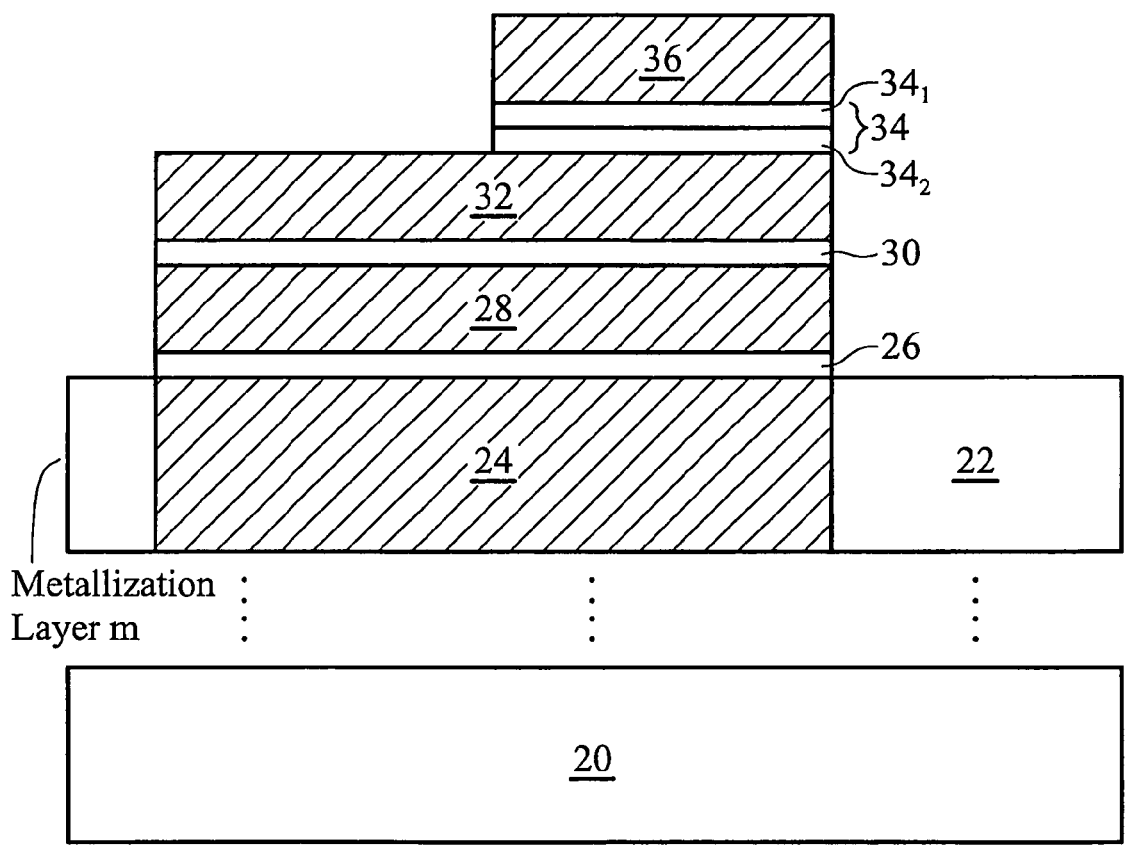

FIG. 4 illustrates the formation of a tunneling layer 34 and a top electrode 36 over control gate 32. In one embodiment, tunneling layer 34 is a single oxide layer, such as a $SiO_2$ layer. In other embodiments, tunneling layer 34 comprises a $SiO_2$ layer $34_1$ and a silicon nitride layer $34_2$. In yet other embodiments, tunneling layer 34 comprises nitrides, oxynitrides, high-k dielectric materials such as $AlLaO_3$, $HfAlO_3$, $HfO_2$, $Ta_2O_5$, $Al_2O_3$, $ZrO_2$, $TiO_2$, $SrTiO_3$, multi-layers thereof, and combinations thereof. In yet other embodiments, tunneling layer 34 comprises two semiconductor layers having a hetero junction at their interface. Tunneling layer 34 preferably has a thickness of less than about 1000 Å, and more preferably less than about 100 Å.

Top electrode 36 is located on tunneling layer 34. In one embodiment, top electrode 36 comprises doped polysilicon. In other embodiments, top electrode 36 comprises conductive materials including metals, metal silicides, metal nitrides, and combinations thereof. Preferably, the metals in top electrode 36 include commonly used metals such as tungsten, copper, silver, tantalum, titanium, and combinations thereof.

Tunneling layer 34 and top electrode 36 are preferably formed by blanket forming the respective layers, and then patterning to form the stacked layers. In the preferred embodiment, tunneling layer 34 and top electrode 36 have smaller areas (viewed from top) than control gate 32.

Figure 5:
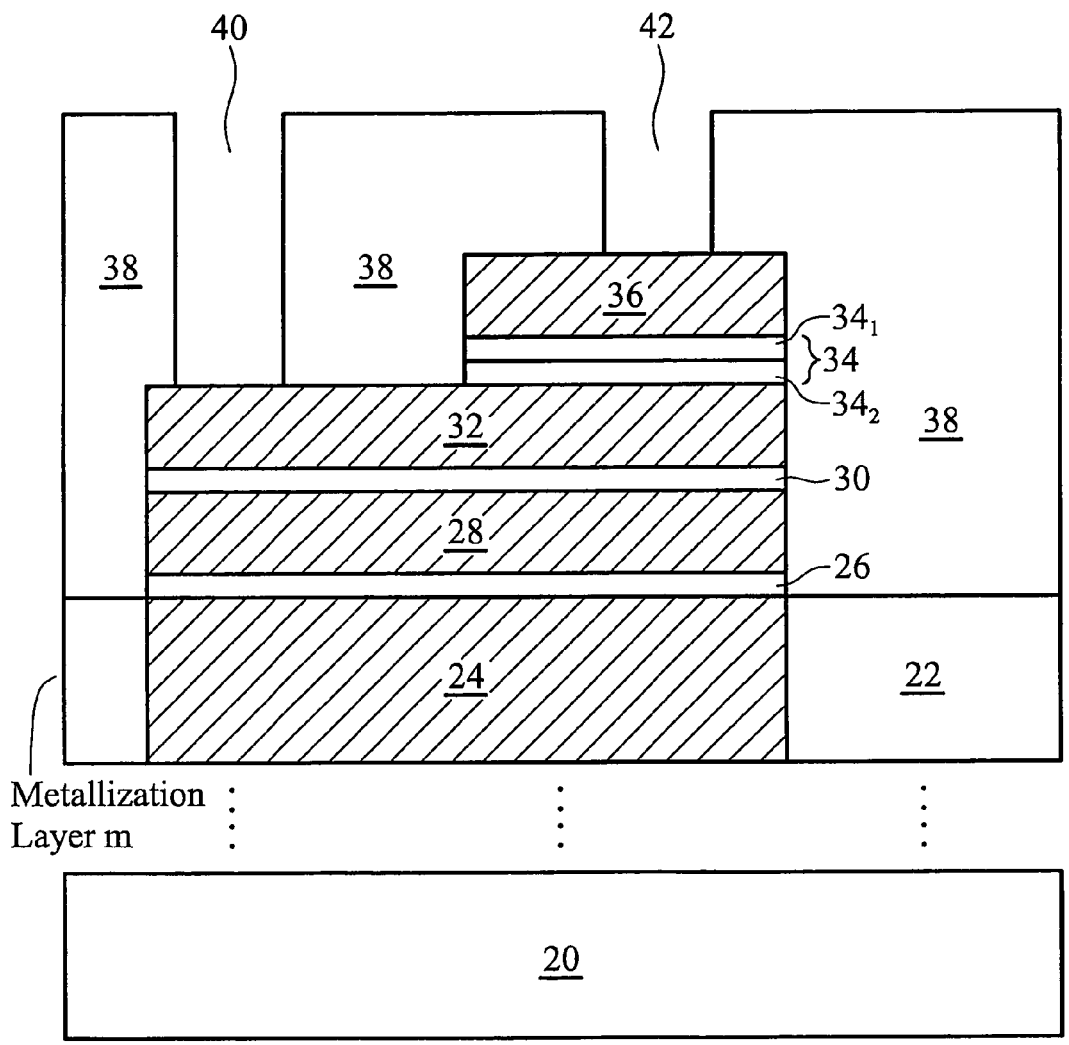

Referring to FIG. 5, a dielectric layer 38, often referred to as an inter-metal dielectric (ILD) 38, is formed. ILD 38 preferably comprises low-k dielectric materials with a dielectric constant (k value) of less than about 3.5, and more preferably less than about 2.5. Openings 40 and 42 are then formed in ILD 38, exposing control gate 32 and top electrode 36, respectively. Metallic materials are then filled into openings 40 and 42, for example, using electroless plating. Excess metallic materials beyond the top surface of ILD 38 are then removed, leaving contact plugs 44 and 46, as is illustrated in FIG. 6.

Figure 6:
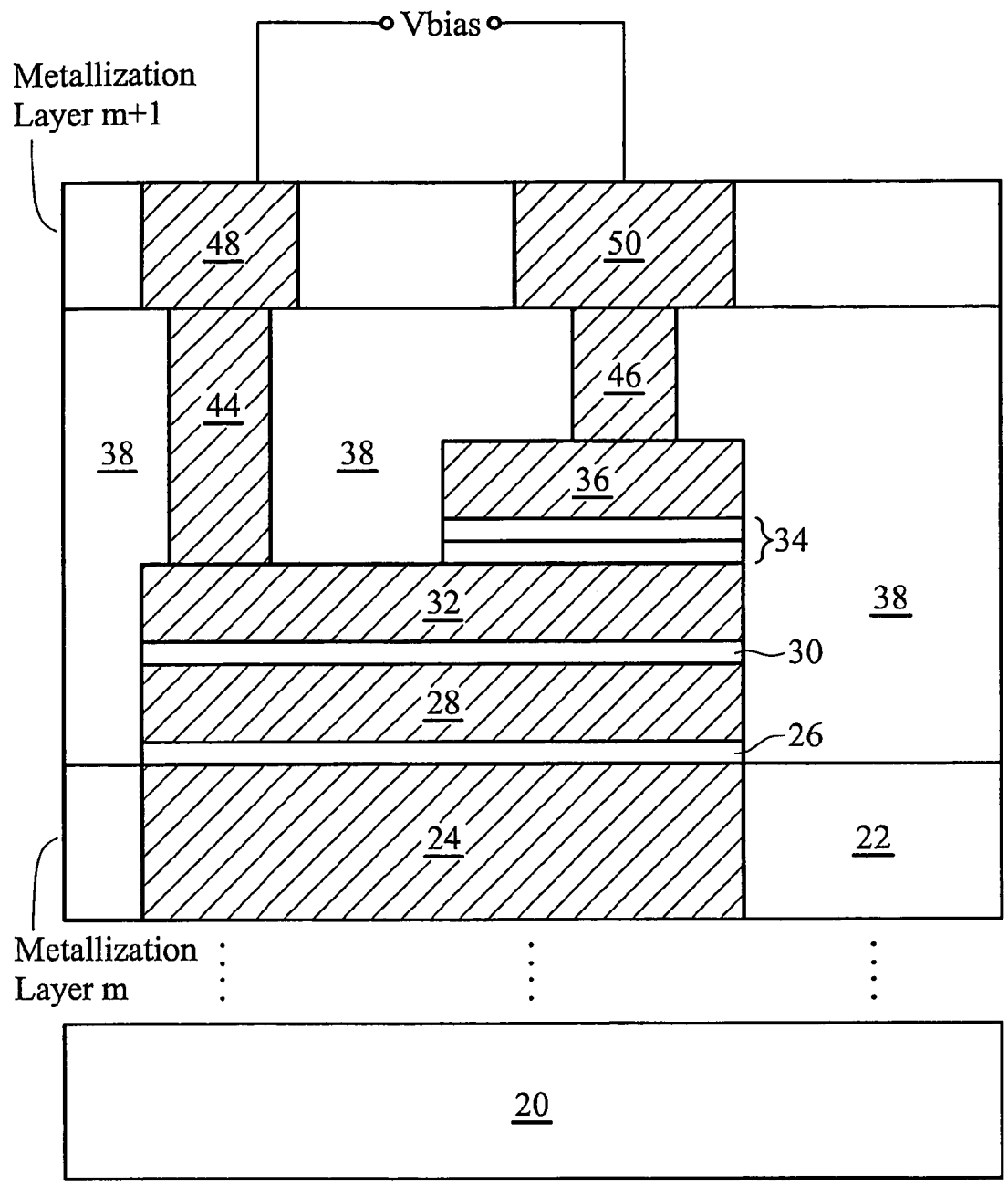

FIG. 6 further illustrates the formation of a word-line 48 and an operating gate 50 in a metallization layer, which is preferably metallization layer m+1, although it can be metallization layer m+2 or the overlying metallization layers. Word-line 48 and operating gate 50 may comprise similar materials and be formed using similar methods as those used for forming bottom electrode 24.

During program operations, a negative bias voltage Vbias is applied between operating gate 50 and word-line 48, with word-line 48 having a higher voltage potential than operating gate 50. Word-line 48 may be grounded or connected to a positive or negative voltage potential. Since word-line 48 is electrically connected to control gate 32, and operating gate 50 is electrically connected to top electrode 36, the bias voltage Vbias is also applied between top electrode 36 and control gate 32. During the program operations, bottom electrode 24 is preferably grounded, although it may be connected to a positive or a negative voltage, which preferably has a voltage higher than a voltage applied on control gate 32. In an exemplary embodiment, bias voltage Vbias is between about −5V and about −7V and word-line 48 is grounded.

Figure 7:
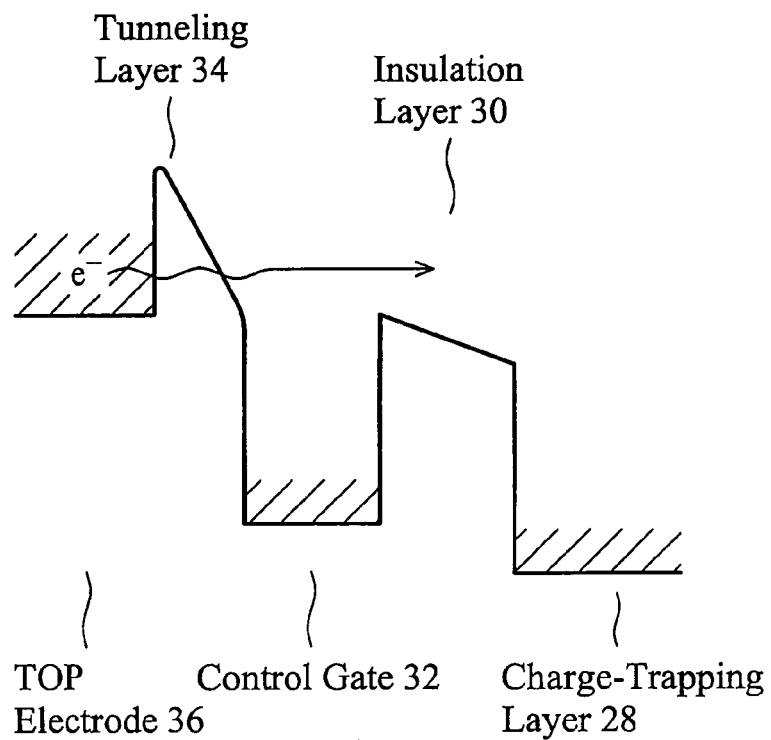
FIG. 7 schematically illustrates an energy band diagram of a program operation.

FIG. 7 illustrates an exemplary energy band diagram during a program operation. Due to an electrical field generated by the bias voltage Vbias, electrons tunnel through tunneling layer 34 by means of, for example, direct tunneling. Electrons will then penetrate control gate 32 and be injected into charge-trapping layer 28. In the preferred embodiment, at least a portion of the electrons have an energy level higher than the conduction band of insulation layer 30, and thus these electrons are ballistic-injected into charge-trapping layer 28. Blocking layer 26 is preferably thick, and preferably has a great band gap, so that the electrons cannot penetrate through it.

Figure 8:
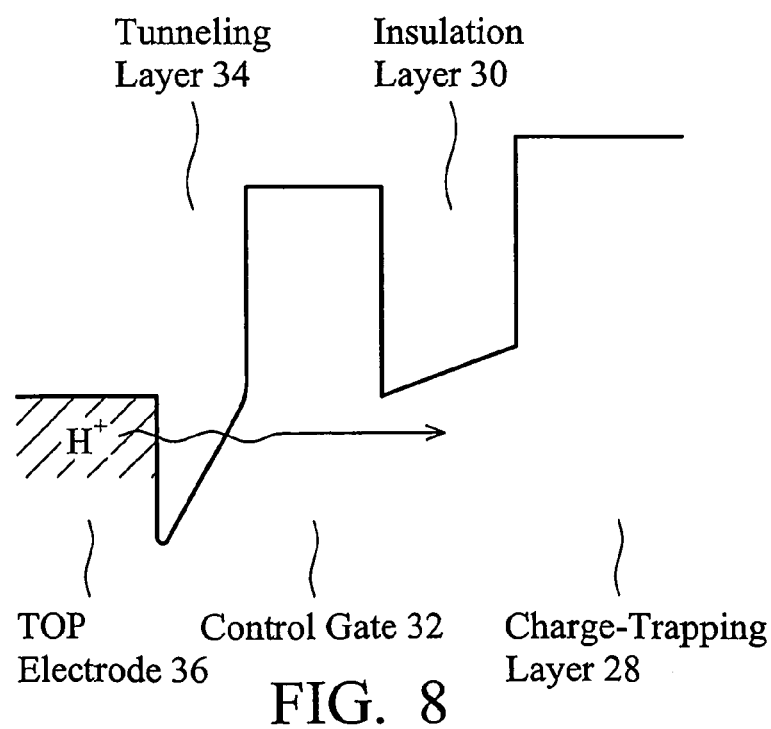
FIG. 8 schematically illustrates an energy band diagram of an erase operation.

An exemplary erase operation is schematically illustrated in FIG. 8, which illustrates the injection of holes. Preferably, in an erase operation, a positive bias voltage Vbias is applied between operating gate 50 and word-line 48 (refer to FIG. 6). In an exemplary embodiment, Vbias is between about 5V and about 7V, while word-line 48 and control gate 32 are grounded. During the erase operations, bottom electrode 24 is preferably grounded, although it may be connected to a positive or a negative voltage, which preferably has a voltage lower than a voltage applied on control gate 32.

Due to an electrical field generated by the positive bias voltage Vbias, holes tunnel through tunneling layer 34 by means of, for example, direct tunneling, and then penetrate control gate 32 and are injected into charge-trapping layer 28. In the preferred embodiment, at least a portion of the holes have an energy level surmounting the valence band of insulation layer 30, and thus these holes are ballistic-injected into charge-trapping layer 28. The injected holes neutralize the electrons in charge-trapping layer 28. It should be appreciated that the tunneling of holes is equivalent to the tunneling of electrons in a reversed direction.

Figure 9:
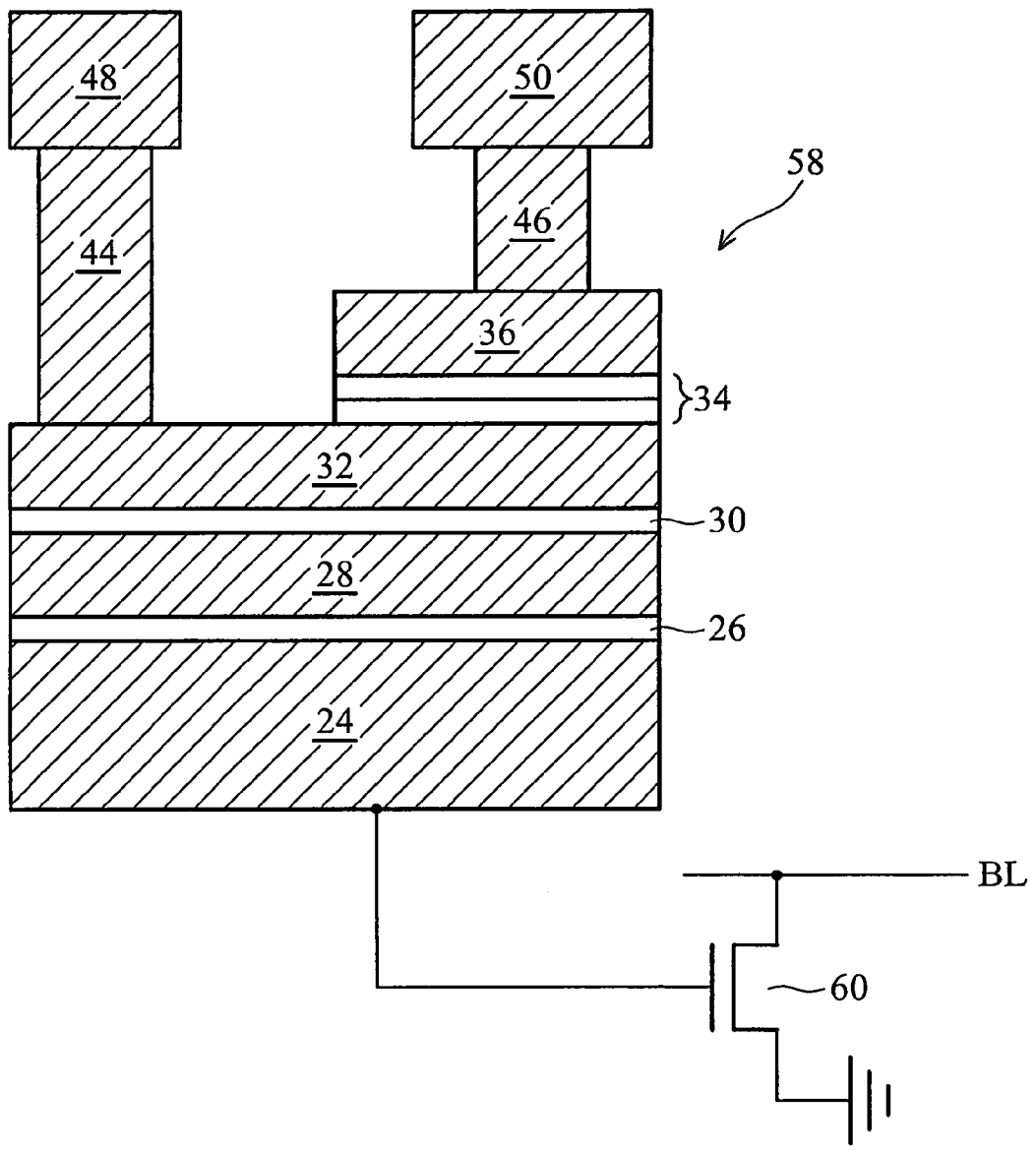
FIGS. 9 and 10 illustrate exemplary circuits for reading the flash memory cell.

FIG. 9 schematically illustrates an exemplary circuit diagram for read operations of a flash memory cell 58. Bottom electrode 24 is connected to a MOS device 60. The source region of MOS device 60 is connected to a bit line BL, and the drain region of MOS device 60 is connected to the ground. If flash memory cell 58 is programmed, charge-trapping layer 28 stores electrons. If the gate stack including layers 24, 26, 28, 30 and 32 and MOS device 60 are treated as an equivalent MOS device, and word-line 48 is treated as a gate of the equivalent MOS device, the electrons in charge-trapping layer 28 will result in an increase in a threshold voltage of the equivalent MOS device. As a result, the threshold voltage of the equivalent MOS device is higher than the intrinsic threshold voltage of MOS device 60. If the voltage applied on word-line 48 is less than the threshold voltage of the equivalent MOS device, MOS device 60 is not turned on, and thus no current (or voltage drop) can be found on bitline BL. On the other hand, if flash memory cell 58 is at an erased state, the threshold voltage of the equivalent MOS device will be lower than the threshold voltage of the equivalent MOS device in the programmed state. The voltage applied on word-line 48 will thus be able to turn on MOS device 60, and a current (or voltage drop) will be detected on bitline BL.

Figure 10:
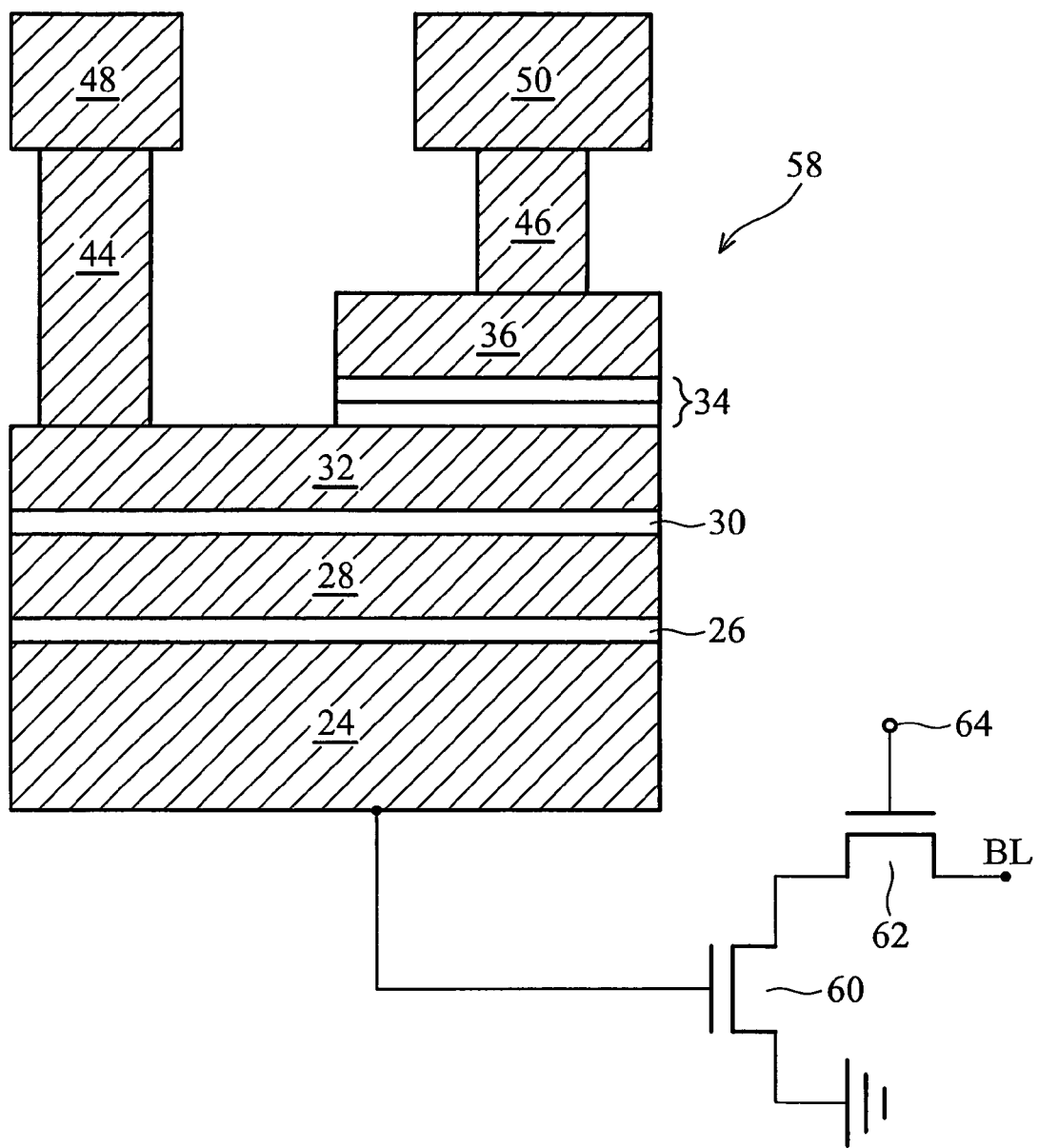

FIG. 10 illustrates a similar read operation as shown in FIG. 9, wherein a MOS device 62 is added for preventing excess leakage current. The function of MOS device 62 is described as follows. If another flash memory cell connected to a same word-line 48 is selected, a high voltage will be applied to word-line 48 even though the current flash memory cell 58 is not selected. When flash memory cell 58 is at an erased state, MOS device 60 is turned on and has a current flowing through it. This current is an undesired leakage current. MOS device 62 is added to prevent the leakage current, wherein a high voltage on selection gate 64 turns on MOS device 62 only when flash memory cell 58 is selected, and a low voltage on selection gate 64 turns off MOS device 62 when flash memory cell 58 is not selected. MOS device 62 may also be used to prevent excess leakage current caused by an over-erased flash memory cell 58, in which case MOS device 60 may be turned on even though a low voltage is applied on word-line 48.

The preferred embodiments of the present invention have several advantageous features. Since a ballistic charge-injection mechanism is used, the efficiency of the embodiments of the present invention is high. For example, the electron injection efficiency can reach more than twenty percent. The reduction in program and erase voltages eliminates the requirement for high-voltage generating circuits, such as charge pumps, thus chip area is saved. In addition, since the embodiments of the present invention are formed in the BEOL processes, there is less concern that the materials used in the formation of the flash memory may pollute the formation of semiconductor devices. Therefore, there are more materials to select from for forming flash memory cells. Particularly, the embodiments of the present invention occupy a small area, and thus are promising for future-generation integrated circuits.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit device comprising:
   a substrate;
   a first dielectric layer overlying the substrate;
   a damascene bottom electrode formed in a first metallization layer within the first dielectric layer over the substrate, wherein the damascene bottom electrode in the first metallization layer is in or over a lowest metallization layer over the substrate;
   a blocking layer over the damascene bottom electrode;
   a charge-trapping layer over the blocking layer;
   an insulation layer over the charge-trapping layer;
   a control gate over the insulation layer;
   a tunneling layer over the control gate; and
   a top electrode over the tunneling layer;
   wherein the blocking layer, charge-trapping layer, insulation layer, control gate, tunneling layer and top electrode are within a second dielectric layer.

2. The integrated circuit device of claim 1 further comprising a word-line electrically connected to the control gate by a contact extending through the second dielectric layer, and an operating gate electrically connected to the top electrode by a contact extending through the second dielectric layer.

3. The integrated circuit device of claim 2, wherein the word-line and the operating gate are formed in a damascene metallization layer over the second dielectric layer.

4. The integrated circuit device of claim 2, wherein the tunneling layer and the top electrode have a smaller area than the control gate, and wherein the word-line is connected to the control gate through a contact plug.

5. The integrated circuit device of claim 1, wherein the charge-trapping layer comprises a material selected from the group consisting essentially of a conductive material and a trap-containing dielectric material.

6. An integrated circuit device comprising:
   a substrate;
   at least one dielectric layer formed over the substrate;
   a first metallization layer formed as a damascene layer in the at least one dielectric layer over the substrate;
   a bottom electrode in the first metallization layer;
   a second metallization layer over the first metallization layer;
   a word-line and an operating gate in the second metallization layer; and
   a stacked structure between the first and the second metallization layers, wherein the stacked structure comprises:
      a blocking layer over the bottom electrode;
      a charge-trapping layer over the blocking layer;
      an insulation layer over the charge-trapping layer;
      a control gate over the insulation layer, wherein the control gate is electrically connected to the word-line;
      a tunneling layer over the control gate; and
      a top electrode over the tunneling layer and electrically connected to the operating gate, wherein the tunneling layer and the top electrode only overlap a portion of the control gate.

7. The integrated circuit device of claim 6, wherein the word-line and the operating gate are connected to the control gate and the top electrode through contact plugs, respectively.

8. The integrated circuit device of claim 6, wherein the charge-trapping layer is formed using a material selected from the group consisting essentially of a conductive material and a trap-containing dielectric material.

* * * * *